Oct. 21, 1958 H. C. LIN 2,857,573

FREQUENCY MODULATED TRANSISTOR OSCILLATOR

Filed May 22, 1953

INVENTOR.

HUNG C. LIN

BY H. O. Newton

ATTORNEY

United States Patent Office 2,857,573

Patented Oct. 21, 1958

2,857,573

FREQUENCY MODULATED TRANSISTOR OSCILLATOR

Hung C. Lin, Levittown, Pa., assignor to Radio Corporation of America, a corporation of Delaware Application May 22, 1953, Serial No. 356,625

9 Claims. (Cl. 332—18)

This invention relates generally to frequency modulation systems and particularly relates to semi-conductor oscillators arranged to produce frequency modulated carrier-wave energy.

The frequency of an oscillator circuit utilizing a semiconductor device or transistor can be changed very readily by changing the direct current voltage or bias on any one of the electrodes. This aspect of transistors has been shown generally in the United States Patent 2,570,938, issued to Hunter C. Goodrich, Jr., for "Variable Reactance Transistor Circuit" on October 9, 1951, and another United States Patent 2,544,211, issued to L. E. Barton, for "Variable Impedance Device," issued on March 6, 1951. It has been found, however, that varying the direct current voltage on any one of the electrodes also varies the amplitude of the oscillation. In other words, if a conventional frequency modulation circuit were utilized, the frequency modulated output of the oscillator circuit would also be accompanied by an undesirable amplitude modulation.

In accordance with the present invention, this undesirable amplitude modulation is avoided by modulating two electrodes at the same time. It has been found that by modulating two electrodes in certain proportions, not only is the amplitude kept constant but the frequency deviation is linear and increased over that obtained by modulating one electrode alone. Thus, one transistor performs the function of a reactance tube, an oscillator and a limiter.

It is accordingly an object of the present invention to provide a semi-conductor oscillator circuit capable of generating a frequency modulated carrier wave of substantially constant amplitude.

It is a further object of the present invention to provide a semi-conductor oscillator circuit capable of producing a linear frequency deviation over a broad range of applied modulating voltage.

It is a still further object of the present invention to provide a semi-conductor oscillator circuit capable of producing linear, broad band, frequency modulated carrier wave energy having substantially constant amplitude.

A frequency modulated oscillator circuit in accordance with the present invention may include a semi-conductor device such as a transistor, having a semi-conductive body and a base electrode, an emitter electrode and a collector electrode in contact therewith. The transistor may be arranged generally in a conventional oscillator circuit with the modulating or control voltage or signal applied to the collector electrode. A predetermined portion of the modulating voltage is selected by means of a voltage divider or other appropriate circuitry to be hereinafter described, and applied either to the base electrode or to the emitter electrode to compensate for the amplitude modulation which would otherwise also be obtained.

The various aspects of the present invention apply equally well to either the junction type of transistor or the point contact type of transistor and accordingly, the following discussion is to be taken as applying equally well to either type of transistor unless it is specifically pointed out that only one of the types can be utilized in the specific circuit under discussion.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing in which:

Figures 1, 2:
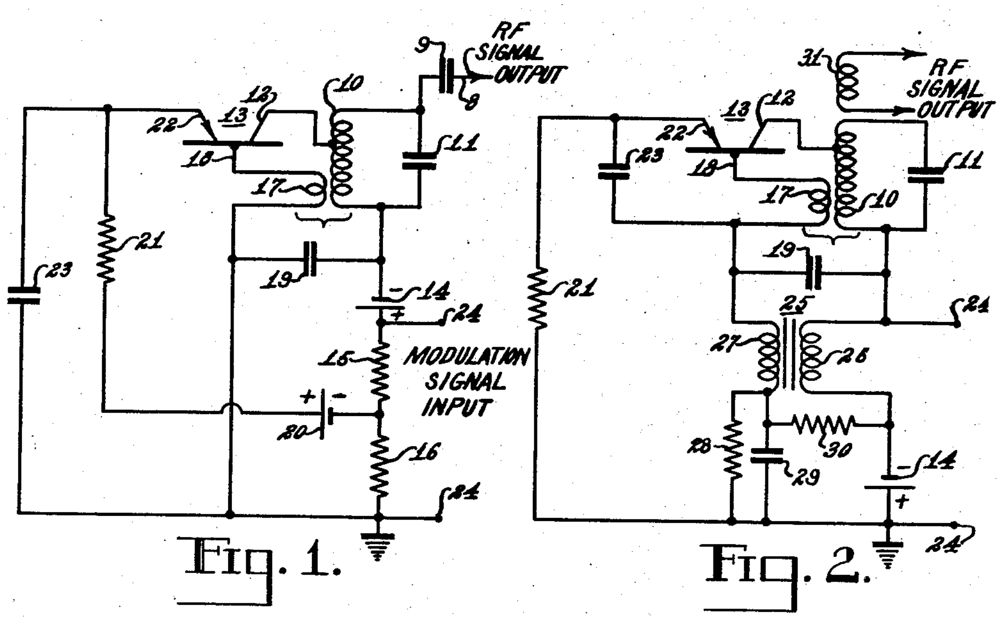
Figure 1 is a schematic circuit diagram of a frequency modulated transistor oscillator circuit utilizing a junction transistor in accordance with the present invention.
Figure 2 is a schematic circuit diagram of a junction transistor oscillator circuit illustrating a further embodiment of the present invention.

Referring now to the drawing in which like components have been designated by the same reference numerals throughout the various figures, and particularly to Figure 1, an inductor 10 and a capacitor 11 are arranged as a parallel resonant circuit which is tuned to the center frequency or carrier-wave frequency of the energy to be generated and coupled to the collector electrode 12 of a junction transistor 13. A source of direct-current operating bias may be provided, such as illustrated, by a battery 14 connected between one terminal of the parallel resonant circuit and one terminal of an impedance element shown in this embodiment of the invention as a voltage divider network comprising a pair of resistors 15 and 16. A feedback inductor 17 is connected between the base electrode 18 and a point of fixed reference potentials such as ground for the system or oscillator circuit, as indicated, and is inductively coupled to the inductor 10 of the parallel resonant circuit. In order to provide a low impedance oscillator frequency signal path between the low potential ends of the inductors 10 and 17, a bypass capacitor 19 is connected directly therebetween. It is noted that the polarity of the battery 14 is such that the collector and base electrodes are biased in a relatively non-conducting direction.

The proper polarity of bias voltage for the emitter electrode 22 is provided by a second source of direct current voltage such as a battery 20 and an isolating resistor 21 which are connected in series between the emitter electrode 22 and the junction of the voltage divider resistors 15 and 16. Accordingly, the emitter and base electrodes are biased in a relatively conducting direction. It is noted that the two batteries are shown as properly poled for p-n-p junction transistors. If n-p-n junction transistors were utilized, the polarity of the batteries would have to be reversed.

A bypass capacitor 23 is also connected between the emitter electrode 22 and ground to serve as a low impedance path for the oscillator frequency energy. A pair of modulation input terminals 24 are connected to the two ends of the voltage divider resistors 15 and 16 to which may be connected any suitable source of modulation signal such as a microphone, the output of a speech amplifier or the like, as will hereinafter be shown. Modulated R.-F. signal output may be taken from the oscillator circuit from any suitable point, such as the high frequency end of the tuned circuit 10—11 through coupling means such as an output lead 8 and a coupling capacitor 9.

The oscillator portion of this circuit operates in the manner of a conventional junction transistor oscillator, that is, the parallel resonant tuned circuit comprising the inductor 10 and the capacitor 11 determine the operating frequency of the oscillator. Energy is fed back from the inductor 10 by means of the mutual coupling between it and the feedback inductor 17 to the base electrode 18 of the transistor. This feedback energy is provided in phase and magnitude, through the coupling shown, to overcome the losses in the circuit and thereby sustain continuous oscillation of the circuit.

Modulation of this generated energy is produced by varying the modulating voltage which is applied to the collector electrode 12 from the modulation input terminals 24. The reactive characteristic of the transistor is modified in accordance with this modulating voltage, and accordingly the frequency of oscillation of the transistor oscillator is modified or modulated in accordance with the modulating voltage. However, it has been found, as above mentioned, that when the modulating voltage is applied only to the collector electrode or to any one of the electrodes, there is usually produced an amplitude variation or modulation in addition to the frequency modulation.

In accordance with the present invention, a portion of the modulating voltage, as determined by the relative magnitude of the voltage divider resistors 15 and 16, is applied to the emitter electrode 22 by means of a circuit connection including the external emitter resistance 21 and the additional bias battery 20, which as above mentioned, are connected directly between the emitter electrode 22 and the junction of the voltage divider resistors 15 and 16. It has been found that when a predetermined portion of the modulating voltage which is applied to the collector electrode 12 is thus applied between the emitter and base electrodes as above described, the heretofore encountered undesirable amplitude variation does not occur, and that linear frequency modulation without amplitude variation over a broad range can be produced. The ratio of the two resistors 15 and 16 is adjusted until this resultant operation is attained.

A further aspect of the present invention will now be discussed in connection with Figure 2. This embodiment utilizes a transistor oscillator which is substantially identical to the transistor oscillator above described in connection with Figure 1. In this instance, however, the modulating voltage is applied to the oscillator circuit by means of a modulation transformer 25 rather than the voltage divider resistor network as described in connection with Figure 1.

The modulation transformer 25 comprises a primary winding 26 connected between the parallel resonant circuit 10—11 and the battery 14, and a secondary winding 27 connected directly between the low voltage end of the feedback inductor 17 and one end of a bias resistor 28. The bias resistor 28 may be bypassed at modulation frequencies by a capacitor 29. An additional resistor 30 is connected between the negative terminal of the battery 14 and the ungrounded end of the bias resistor 28.

The two resistors 28 and 30, effectively in series, serve as a voltage divider network for providing the proper bias to be applied between the emitter electrode 22 and the base electrode 18 without the use of an additional bias battery as was required in the circuit shown in Figure 1.

The operation of the transistor oscillator per se is conventional as mentioned in connection with Figure 1. However, in this embodiment of the invention, the percentage of modulating voltage which is selected to be applied between the emitter and base electrodes is determined by the characteristics of the modulation transformer 25. The transformation ratio of the modulation transformer and the polarity of the secondary connection is such that, as in the circuit of Figure 1, the modulation energy applied between the emitter and base electrodes of the oscillator circuit from the input terminals 24 is of magnitude and phase to provide linear frequency modulation of the transistor oscillator circuit without amplitude variation.

Modulated signal output energy may be derived from the tuned circuit 10—11 by any suitable coupling means such as a pick-up coil 31 inductively coupled with the tuning inductor 10 as shown.

Figure 3:
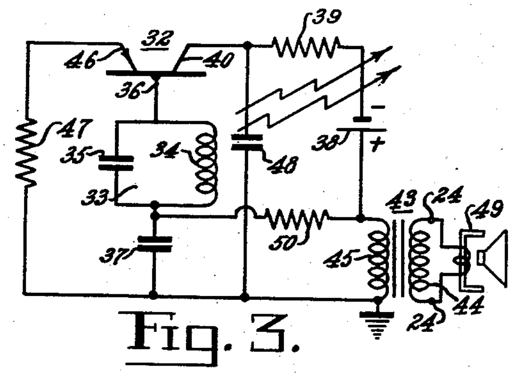
Figure 3 is a schematic circuit diagram of a point contact transistor oscillator circuit arranged in accordance with the present invention for frequency modulation.

Referring now to Figure 3 of the drawing, there is illustrated a transistor oscillator utilizing a point contact transistor 32 and including a parallel resonant circuit 33 comprising an inductor 34 and a capacitor 35. The parallel resonant circuit 33 determines the operating frequency of the transistor oscillator and is connected between the base electrode 36 and the ungrounded end of a bypass capacitor 37.

Bias voltages for the transistor oscillator are provided by a battery 38 which is connected in series with a first modulation impedance element or resistor 39 to the collector electrode 40 of the point contact transistor 32, and poled to bias the collector and base electrodes in a relatively nonconducting direction.

A modulation transformer 43 including a primary winding 44 and a secondary winding 45 has its secondary winding connected directly between the positive terminal of the battery 38 and ground. A bias voltage of correct magnitude and polarity is provided for the emitter electrode 46 by means of an emitter resistor 47 connected between the emitter electrode 46 and ground. A bypass capacitor 48 which provides a low impedance path at the oscillator frequency is connected between the collector electrode 40 and ground in order to remove the effect of the oscillator energy from the battery 38 and from the modulation source which may be connected to the modulation input terminals 24.

The direct current circuit and the modulation circuit for the transistor oscillator are completed by means of a second modulation impedance element or resistor 50 connected between the positive terminal of the battery 38 and the low signal potential end of the parallel resonant circuit 33.

The oscillator portion of the circuit operates in the manner of a conventional point contact type of transistor oscillator. There is no requirement of an external feedback as the feedback which is necessary to produce and sustain oscillation is provided by the negative resistance characteristic of the transistor itself. The normal or center frequency of oscillation is determined by the frequency of the parallel resonant circuit 33 which is connected in the base electrode circuit.

Frequency modulation of the oscillator circuit is accomplished by varying the bias potential applied to the collector electrode by means of the modulation transformer 43. The relative proportion of modulating voltage which is applied respectively between the collector and base electrodes and between the emitter and base electrodes is determined by proper proportioning of the modulation resistors 39 and 50 which are respectively connected in the collector electrode and base electrode circuits. Upon proper proportioning of these two resistors, the phase and magnitude of the modulating voltage which is applied between the two above mentioned pairs of electrodes is such that linear broad band frequency modulation occurs without having an undesirable amplitude modulation characteristic.

It has been found possible, with this embodiment of the invention, to connect a dynamic microphone 49 to the terminals 24 and directly across the primary winding 44 to provide a miniature frequency modulated transmitter which may be conveniently utilized in combination with a radio receiver as a wireless public address system. Modulated signals are radiated directly, as indicated, from the tuned circuit inductor 10 or through suitable coupling means as described in connection with a modification of the circuit of Figure 3 shown in Figure 4, to which attention is now directed.

Figure 4:
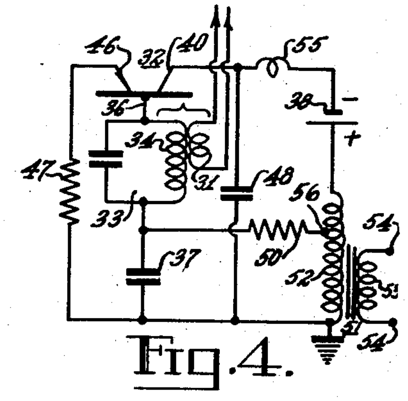
Figure 4 is a schematic circuit diagram of a point contact transistor oscillator circuit arranged for frequency modulation and illustrating a further embodiment of the present invention.

The voltage divider action required to proportion the amount of the modulating voltage which is to be applied to the two respective circuits is accomplished in the circuit of Figure 4 by means of a modulation transformer 51 having a tapped secondary winding 52 and a primary winding 53. The modulating voltage is applied to the modulation input terminals 54 which are connected to the ends of the primary winding 53. A radio-frequency choke coil 55 is connected between the collector electrode 40 and the negative terminal of the bias battery 38, similar to the resistor 39 of Figure 3, to prevent the oscillator energy from affecting the voltage of the bias battery 38 or the modulation source. In this embodiment of the invention the ratio of the number of turns between the two ends of the secondary winding and the secondary tap 56 are selected such that the proper proportion and phase of the modulating voltage is applied to the collector and base electrodes thereby establishing linear broad band frequency modulation in accordance with the above stated fundamentals and without an undesirable amplitude modulation component. In this circuit, modulated output signals are derived from the tuned circuit 10—11 by a pick-up coil 31 as in the embodiment shown in Figure 2.

Figure 5:
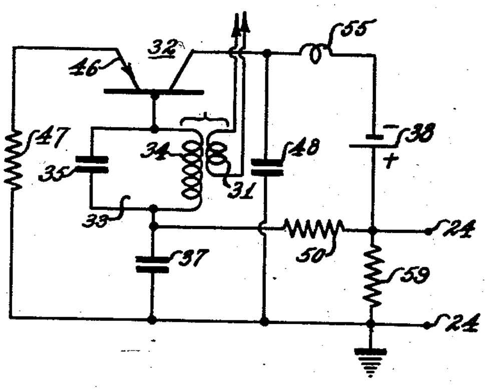
Figure 5 is a schematic circuit diagram of a point contact transistor oscillator circuit arranged for frequency modulation and illustrating a still further embodiment of the invention.

Referring to Figure 5 and a modification of the circuit of Figure 4, the voltage divider action which is required to proportion the extent of modulating voltage which is applied to the collector and base electrodes is determined by the external resistor 50 in combination with the base resistance of the transistor 32. The modulating voltage is applied to the modulation input terminals 24 which are connected across a modulation input impedance illustrated as a resistor 59. The resistor 50, which is connected between the low signal voltage end of the parallel resonant circuit 33 and the positive terminal of the battery 38, is so selected that in combination with the base resistance of the transistor 32, the proper proportion of the modulating voltage is applied to the emitter-base electrode circuit to prevent amplitude variation and to provide constant amplitude frequency modulation in a broad band of frequencies.

A frequency modulated oscillator circuit in any of the specific embodiments of the invention that have been shown, make it possible to couple with any convenient source of modulation energy to provide constant amplitude, linear frequency modulation. As has been shown and described, undesired amplitude modulation is prevented or minimized by the dual modulation of two transistor electrodes in predetermined proportions from the modulation signal source. The resultant constant amplitude of the output signal and linear frequency deviation are characteristic of this improved transistor modulated oscillator circuit. In addition, one transistor effectively performs the function of reactance tube, oscillator and limiter in the improved oscillator circuit of this invention.

What is claimed is:

1. In combination with a semi-conductor oscillator circuit including a semi-conductor device having a collector electrode, an emitter electrode and a base electrode, a voltage divider network connected in circuit with said collector and base electrodes for applying a modulating signal therebetween, and means including a portion of said voltage divider network connected in circuit with said emitter and base electrodes for applying a predetermined portion of said modulating signal in phase with the modulating voltage on the collector electrode between said emitter and base electrodes for providing constant amplitude linear, broad band, frequency modulation of said oscillator circuit.

2. A frequency modulation system comprising, in combination, an oscillator circuit including a semi-conductor device provided with a collector electrode, an emitter electrode and a base electrode, means connected for biasing said collector and base electrodes in a relatively non-conducting polarity and for biasing said emitter and base electrodes in a relatively conducting polarity, a parallel resonant circuit connected between said base electrode and a point of fixed reference potential, a first and second resistor connected in series with the base resistance of said semi-conductor device, and a modulation input circuit connected across said second resistor for applying a modulating voltage to said circuit, said first resistor being so proportioned with respect to said base resistance that said modulating voltage is applied in a predetermined portion and phase relation between the collector and base electrodes and between the emitter and base electrodes for frequency modulating said semi-conductor oscillator circuit without amplitude variation.

3. A frequency modulated oscillator circuit comprising, in combination, a semi-conductor device having an emitter electrode, a collector electrode and a base electrode, means connected for biasing said collector and base electrodes in a relatively non-conducting polarity and for biasing said emitter and base electrodes in a relatively conducting polarity, a parallel resonant circuit coupled between said collector and base electrodes for determining a mean operating frequency for said oscillator circuit, an impedance element connected in circuit with said collector and base electrodes, a pair of input terminals connected across said impedance element for impressing a modulating signal thereacross, and means connected between said emitter electrode and an intermediate point on said impedance element for applying a predetermined portion of said modulating signal in phase between said emitter and base electrodes and providing linear broad band frequency modulation without undesirable amplitude modulation.

4. A frequency modulated oscillator circuit comprising the combination defined in claim 3, wherein said impedance element comprises a pair of resistors in series arrangement.

5. A frequency modulated oscillator circuit comprising the combination defined in claim 3, wherein said impedance element comprises a modulation transformer having a tapped secondary winding.

6. A frequency modulated oscillator circuit comprising in combination, a semi-conductor device having an emitter electrode, a collector electrode and a base electrode, means for biasing said collector and base electrodes in a relatively non-conducting polarity and for biasing said emitter and base electrodes in a relatively conducting polarity, a parallel resonant circuit coupled between said collector and base electrodes for determining a mean operating frequency for said oscillator circuit, a modulation transformer having a primary winding and a secondary winding, means for connecting said windings in series and defining a junction therebetween, means for connecting said windings serially in circuit respectively with said collector and base electrodes, a pair of input terminals connected across said primary winding for impressing a modulating signal thereacross, and means connected between said emitter electrode and the junction of said primary and secondary windings for applying a predetermined portion of said modulating signal between said emitter and base electrodes for providing linear broad band frequency modulation without undesired amplitude modulation.

7. A frequency modulated oscillator circuit comprising in combination, a semi-conductor device having an emitter electrode, a collector electrode, and a base electrode, means for biasing said collector and base electrodes in a relatively non-conducting polarity and for biasing said emitter and base electrodes in a relatively conducting polarity, a parallel resonant circuit coupled between said collector and base electrodes for determining the natural frequency of said oscillator circuit, a modulation transformer having a primary winding and a secondary winding, a first impedance element connected in circuit with said collector electrode and one terminal of said secondary winding, a second impedance element connected between the low signal voltage end of said parallel resonant circuit and said one terminal of said secondary winding, and a pair of input terminals connected to said primary winding for impressing a modulating signal thereacross, said first impedance element and said second impedance element being so proportioned as to apply a predetermined portion of said modulating signal between said emitter and base electrodes for providing linear broad band frequency modulation without undesirable amplitude modulation.

8. The combination comprising a frequency modulated semi-conductor oscillator circuit including a semiconductor device having a collector electrode, an emitter electrode and a base electrode; means for biasing said collector and base electrodes in a relatively non-conducting polarity and for biasing said emitter and base electrodes in a relatively conducting polarity; circuit means connected with said device for establishing a mean oscillator frequency; modulation means connected in circuit with said collector and base electrodes for applying a modulating signal therebetween to modulate said oscillator circuit with respect to said mean frequency, said modulation means comprising a voltage divider network including a pair of resistors connected in series between said collector and base electrodes; and further modulation means connected in circuit with said emitter and base electrodes for applying a predetermined portion of said modulating signal in phase with the modulating signal applied between said collector and base electrodes between said emitter and base electrodes to neutralize undesired amplitude modulation in said oscillator circuit.

9. The combination comprising a frequency modulated semi-conductor oscillator circuit including a semiconductor device having a collector electrode, an emitter electrode and a base electrode; means for biasing said collector and base electrodes in a relatively non-conducting polarity and for biasing said emitter and base electrodes in a relatively conducting polarity; circuit means connected with said device for establishing a mean oscillator frequency; modulation means connected in circuit with said collector and base electrodes for applying a modulating signal therebetween to modulate said oscillator circuit with respect to said mean frequency, said modulation means comprising a modulation transformer including primary and secondary windings, said primary winding being connected between said collector electrode and a point of fixed reference potential, said secondary winding being connected between said base electrode and said point of fixed reference potential; and further modulation means connected in circuit with said emitter and base electrodes for applying a predetermined portion of said modulating signal in phase with the modulating signal applied between said collector and base electrodes between said emitter and base electrodes to neutralize undesired amplitude modulation in said oscillator circuit.

References Cited in the file of this patent

UNITED STATES PATENTS

| | | |
|---|---|---|
| 1,999,176 | Albersheim | Apr. 30, 1935 |
| 2,281,069 | Hofer | Apr. 28, 1942 |
| 2,310,260 | Schock | Feb. 9, 1943 |
| 2,541,649 | Hepp | Feb. 13, 1951 |
| 2,629,858 | Koros | Feb. 24, 1953 |